United States Patent
Sawai (10) Patent No.: US 6,285,209 B1
(45) Date of Patent: Sep. 4, 2001

(54) INTERFACE CIRCUIT AND INPUT BUFFER INTEGRATED CIRCUIT INCLUDING THE SAME

(75) Inventor: Yasunori Sawai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/395,570

(22) Filed: Sep. 14, 1999

(30) Foreign Application Priority Data

Sep. 16, 1998 (JP) .................................................. 10-260736

(51) Int. Cl.⁷ .................................................... H03K 17/16
(52) U.S. Cl. ................................... 326/34; 326/30; 326/83
(58) Field of Search ...................... 326/30, 31, 34, 326/83, 86

(56) References Cited

U.S. PATENT DOCUMENTS 5,134,311 * 7/1992 Biber et al. ............................. 326/83
5,598,119 * 1/1997 Thayer et al. .......................... 326/83
5,663,663 * 9/1997 Cao et al. ............................... 326/83
5,949,249 * 9/1999 Preuss et al. ........................... 326/27

FOREIGN PATENT DOCUMENTS 10-126316    5/1998   (JP) .

OTHER PUBLICATIONS

Japanese Office Action, dated Sep. 12, 2000, with English language translation of Japanese Examiner's comments.

* cited by examiner

Primary Examiner—Michael Tokar
Assistant Examiner—Don Phu Le
(74) Attorney, Agent, or Firm—McGuireWoods LLP (57) ABSTRACT

An interface circuit effectively prevents ringing of signal waveform. In a buffer integrated circuit, a level of an input signal to an input buffer and a reference level are compared by a comparator. A transistor is operated to be turned ON and OFF depending upon the comparison result to control level of the input signal. Even when the ringing of the waveform from the output buffer is large, ringing may not be recognized as "H" level signal so as not to cause malfunction.

15 Claims, 11 Drawing Sheets

INTERFACE CIRCUIT AND INPUT BUFFER INTEGRATED CIRCUIT INCLUDING THE SAME

BACKGROUND OF THE INVENTION

1. Field of the Invention

The present invention relates generally to an interface circuit and an input buffer integrated circuit including the same. More particularly, the invention relates to an interface circuit which is provided in a peripheral device or so forth inputting an output signal of a personal computer (hereinafter referred to as PC) or the like for controlling an input signal level of an input buffer inputting the output signal of the PC or the like, and an input buffer integrated circuit including the same.

2. Description of the Related Art

Figure 10:
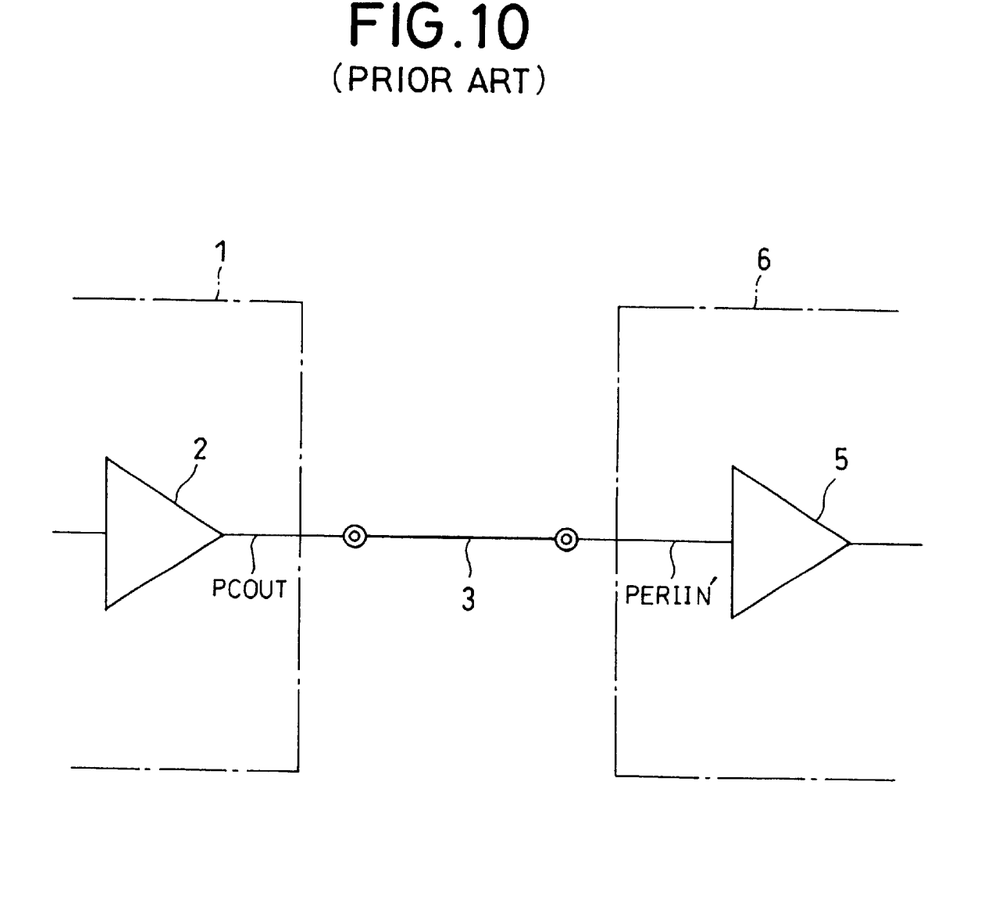
FIG. 10 is an illustration showing a construction of the conventional interface performing exchange of data between a PC and a peripheral device.

FIG. 10 is an illustration showing a construction of the conventional interface performing exchange of data between a PC and a peripheral device. The interface shown in FIG. 10 is constructed with an output buffer 2 on the side of the PC, an input buffer 5 on the side of the peripheral device and a cable 3 connecting both buffers. The output buffer 2 is provided in a buffer integrated circuit 1 integrated into a single chip. On the other hand, the input buffer 5 is provided within a buffer integrated circuit 6 integrated into a single chip.

Figure 11:
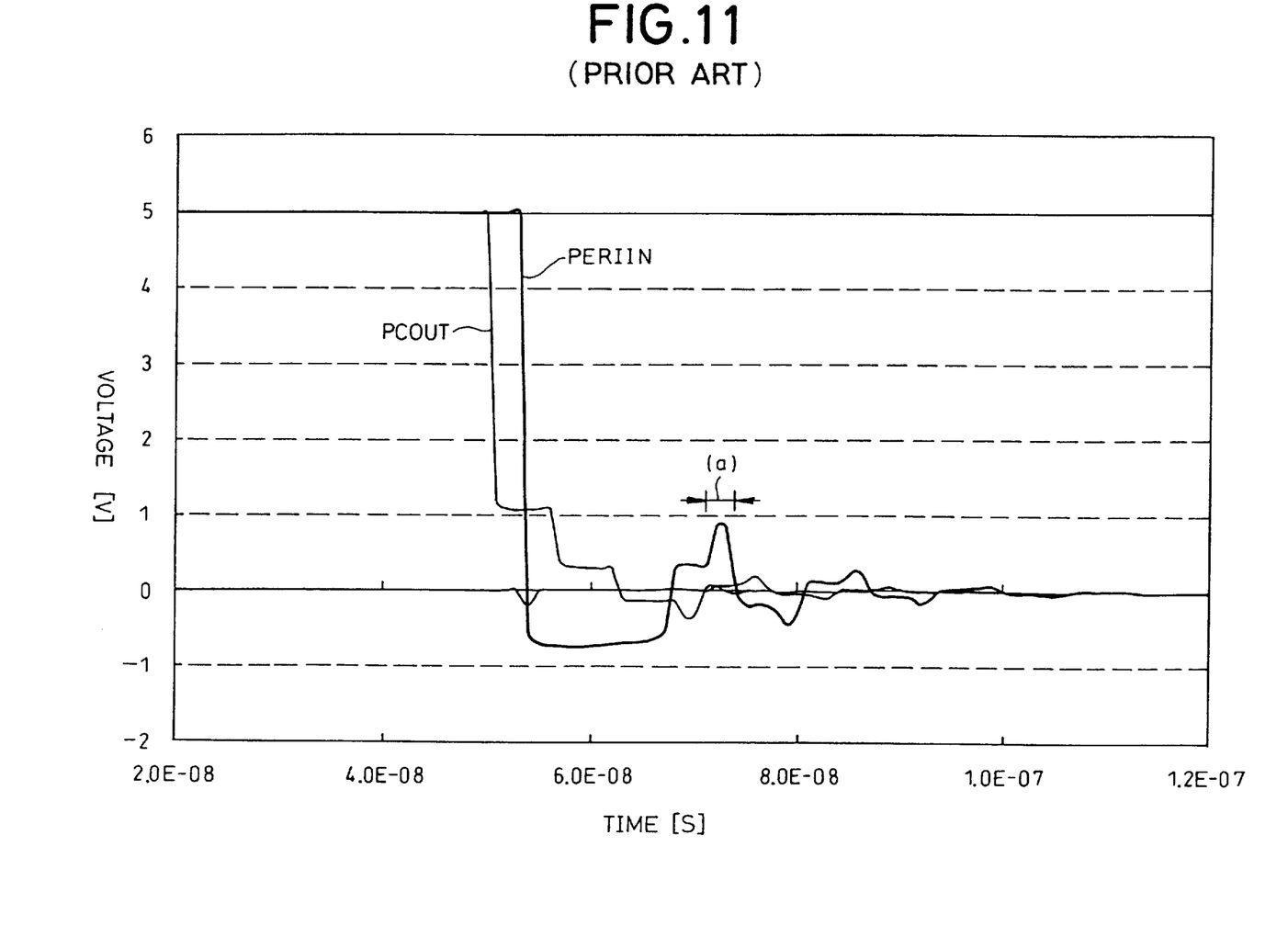
FIG. 11 is an illustration showing waveforms of respective signals in FIG. 10.

In such interface, if impedances of an output stage of the output buffer 2 and an input stage of the input buffer are unmatching with each other, reflection is caused in the signal at the input stage of the input buffer 5. Due to reflection, ringing, such as simulation waveform shown in FIG. 11 is caused in the signal of the input stage of the input buffer 5. In FIG. 11, PCOUT corresponds to an output waveform of the output buffer 2 on the side of PC shown in FIG. 10, and PERIN corresponds to an input waveform of the input buffer 5 on the side of the peripheral device, respectively. It should be noted that FIG. 11 shows an operation upon falling down of the signal.

On the other hand, an advanced technology (AT) interface to be frequently used in the interface between the PC and the peripheral device, exchange of data is performed according to transistor transistor logic (TTL) standard. Therefore, if ringing exceeds 0.8V of the waveform in a period (a) in FIG. 11, ringing can be erroneously recognized as "H" level signal to result in malfunction in the input buffer 5 on the side of the peripheral device.

Essentially, ringing due to reflection can be reduced by matching of impedances. However, for the peripheral device, for which connection with unspecified PC, impedance matching is difficult to establish for variation of condition for difference of specification and material of output driver, connection cable, connecting connector and so forth.

Therefore, seeking for impedance matching cannot be effective measure for ringing.

SUMMARY OF THE INVENTION

The present invention has been worked out in order to solve the problems in the prior art set forth above. Therefore, it is an object of the present invention to provide an interface circuit which can effectively prevent ringing of a signal waveform, and an input buffer integrated circuit including the same.

According to the first aspect of the present invention, an interface circuit provided in a second device inputting an output signal of a first device, controlling an input signal level to an input buffer inputting the output signal, comprises control means for controlling the input signal level depending upon a result of comparison of a level of the output signal and a predetermined reference level.

In the preferred construction, the control means includes a comparator circuit comparing the output signal level and the reference level and a switching element turning ON and OFF depending upon the result of comparison of the comparator circuit for controlling the input signal level.

According to the second aspect of the present invention, an input buffer integrated circuit comprises:

an input buffer provided in a second device inputting an output signal of a first device and inputting the output signal;

an interface circuit provided in the second device, integrated with the input buffer on a single chip for forming an integrated circuit, and including control means for controlling a level of the input signal depending upon a result of comparison of a level of the output signal and a predetermined reference level.

In the preferred construction, the control means includes a comparator circuit comparing the output signal level and the reference level and a switching element turning ON and OFF depending upon the result of comparison of the comparator circuit for controlling the input signal level.

In short, in accordance with the present invention, in an interface between a PC and its peripheral device (magnetic disk drive, floppy disk drive or so forth), an active clamping circuit is provided on an input portion of the input buffer of the peripheral device.

Then, by setting the reference voltage at −0.3V, for example, ringing due to under-shooting of the input waveform can be suppressed. On the other hand, by modification of the circuit construction, it may be possible to clamp the voltage level higher than or equal to a predetermined level to suppress ringing due to over-shooting.

BRIEF DESCRIPTION OF THE DRAWINGS

The present invention will be understood more fully from the detailed description given here below and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention. It should be noted that like components will be identified by like reference numerals throughout the disclosure.

Figure 1:
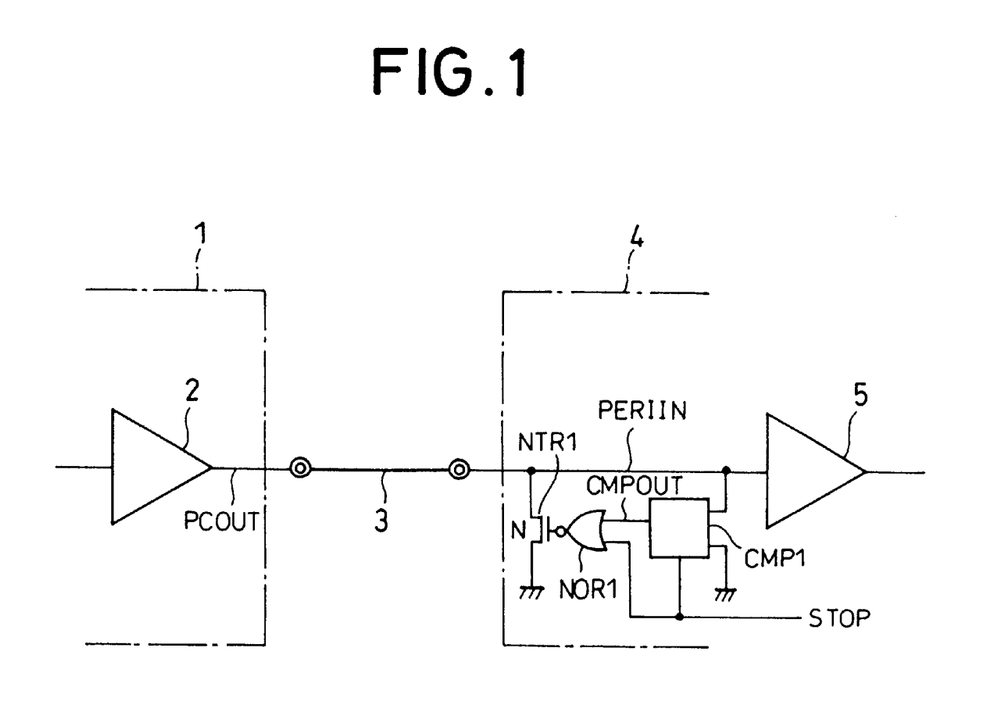
FIG. 1 is a block diagram showing a construction of the first embodiment of an interface circuit and an input buffer integrated circuit including the same according to the present invention.

FIG. 1 is a block diagram showing a construction of the first embodiment of an interface circuit and an input buffer integrated circuit including the same according to the present invention. In FIG. 1, an output buffer 2 is provided in a buffer integrated circuit 1. On the other hand, an input buffer 5 is provided in a buffer integrated circuit 4. These output buffer 2 and the input buffer 5 are connected through a cable 3. The buffer integrated circuit 4 is constructed with a comparator CMP1, a clamping transistor NTR1 and a two-input NOR gate NOR1 in addition to the input buffer 5.

Figure 2:
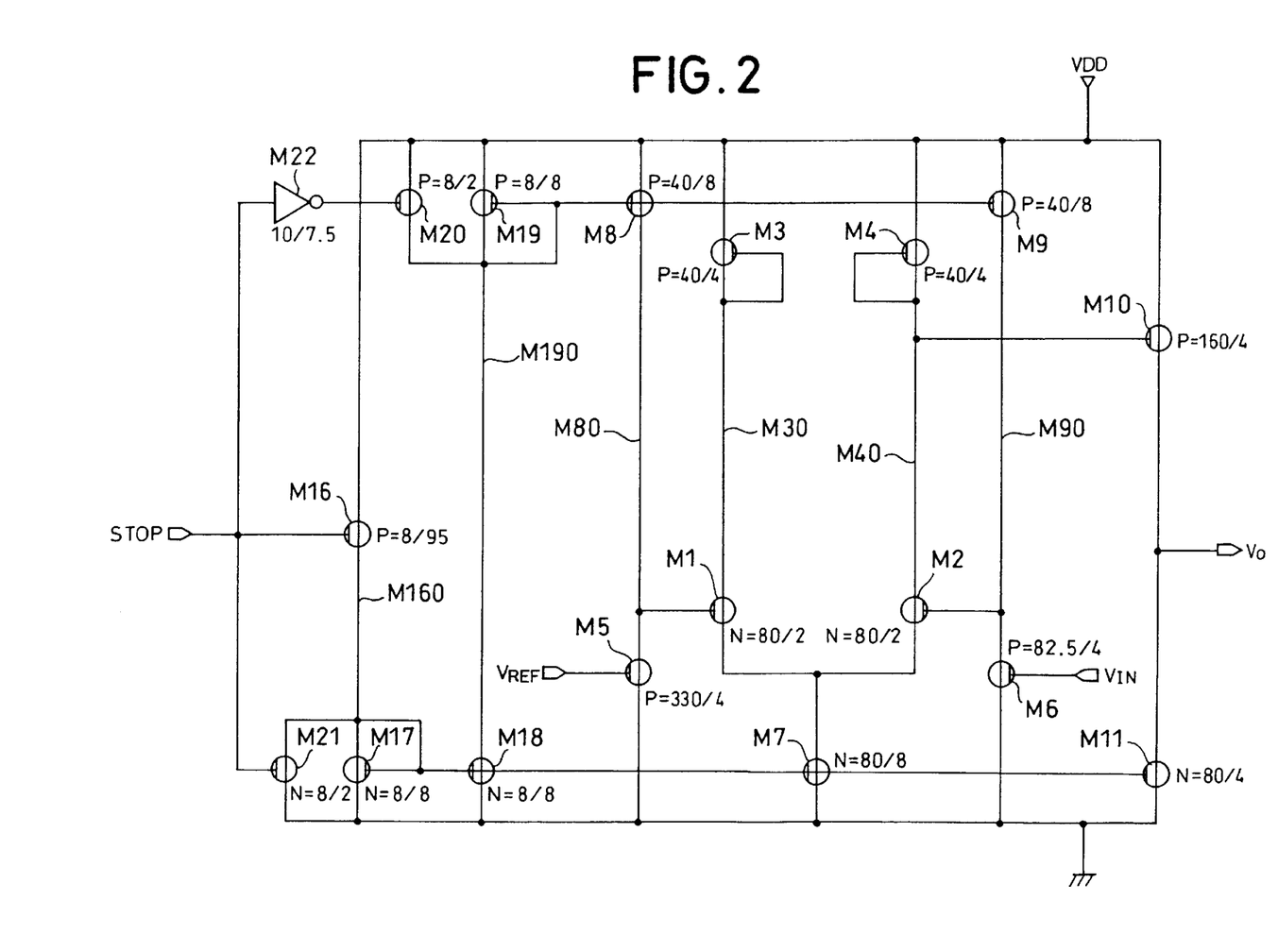
FIG. 2 is an illustration showing one example of a circuit construction of a comparator in FIG. 1.

Here, one example of a circuit construction of the comparator CMP1 is shown in FIG. 2. In FIG. 2, the comparator CMP1 has a reference potential input terminal VREF, a comparator signal input terminal VIN, a stop signal input terminal STOP and a comparison result output terminal V0, and constructed with transistors M16, M17, M18 and M19 for generating a bias voltage, transistors M8, M5, M9, M6, M3, M1, M4 and M2 for forming a differential comparing portion, transistors M10 and M11 constructed with a comparison result output portion, transistors M21 and M20 for stopping operation by inputting a stop signal, and an inverter M22.

It should be noted that, in FIG. 2, "N=W/L" or "P=W/L" (W and L are arbitrary numeric value) added for each transistor represents size of the transistor, in which W represents a gate width and L represents a gate length. N represents N-type MOS (Metal Oxide Semiconductor) transistor, P represents P-type MOS transistor. The inverter 22 is constructed with a PMOS transistor and an NMOS transistor. 10/7.5 represents a ratio of a size of the PMOS transistor and a size of NMOS transistor (PMOS transistor size/NMOS transistor size).

The comparator illustrated in FIG. 2 is constructed with a typical circuit. However, the transistor M5 and the transistor M6 of the differential comparing portion are different in transistor size. By this, the comparator operates as comparator with an offset.

At first, discussion will be given for the case where the stop signal input terminal STOP is "H". In this case, the transistor M16 is held OFF and the transistor M21 is held ON. Then, the potential of a node M160 becomes ground (GND) level. Therefore, the transistors M17, M18, M7 and M11 are held OFF. On the other hand, since the transistor M20 becomes a power source (VDD) level, the transistors M19, M8 and M9 are held OFF. Accordingly, all current paths between the power source (VDD)—ground (GND) are shut off to establish a stop state.

Figure 3:
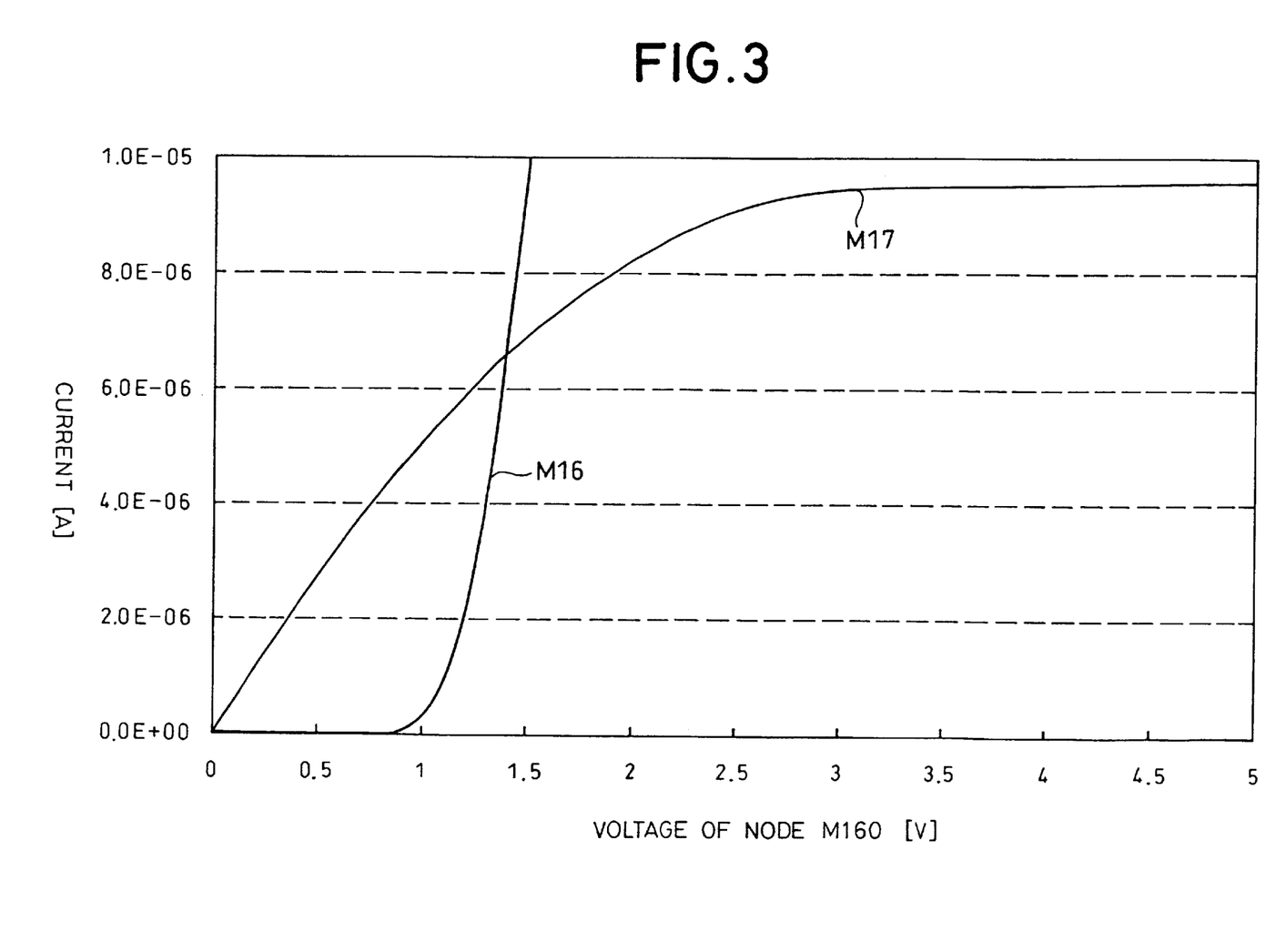
FIG. 3 is an illustration showing operations of transistors M16 and M17 in FIG. 2.

Next, discussion will be given for the case where the stop signal input terminal STOP is "L". In this case, the transistors M21 and M20 are held OFF and the transistor M16 is held ON. Accordingly, a bias voltage is generated at the node M160 by the transistors M16 and M17. A value of the bias voltage is determined to be about 1.4V as an intersection of DC characteristics of both transistors as illustrated in FIG. 3.

Figure 4:
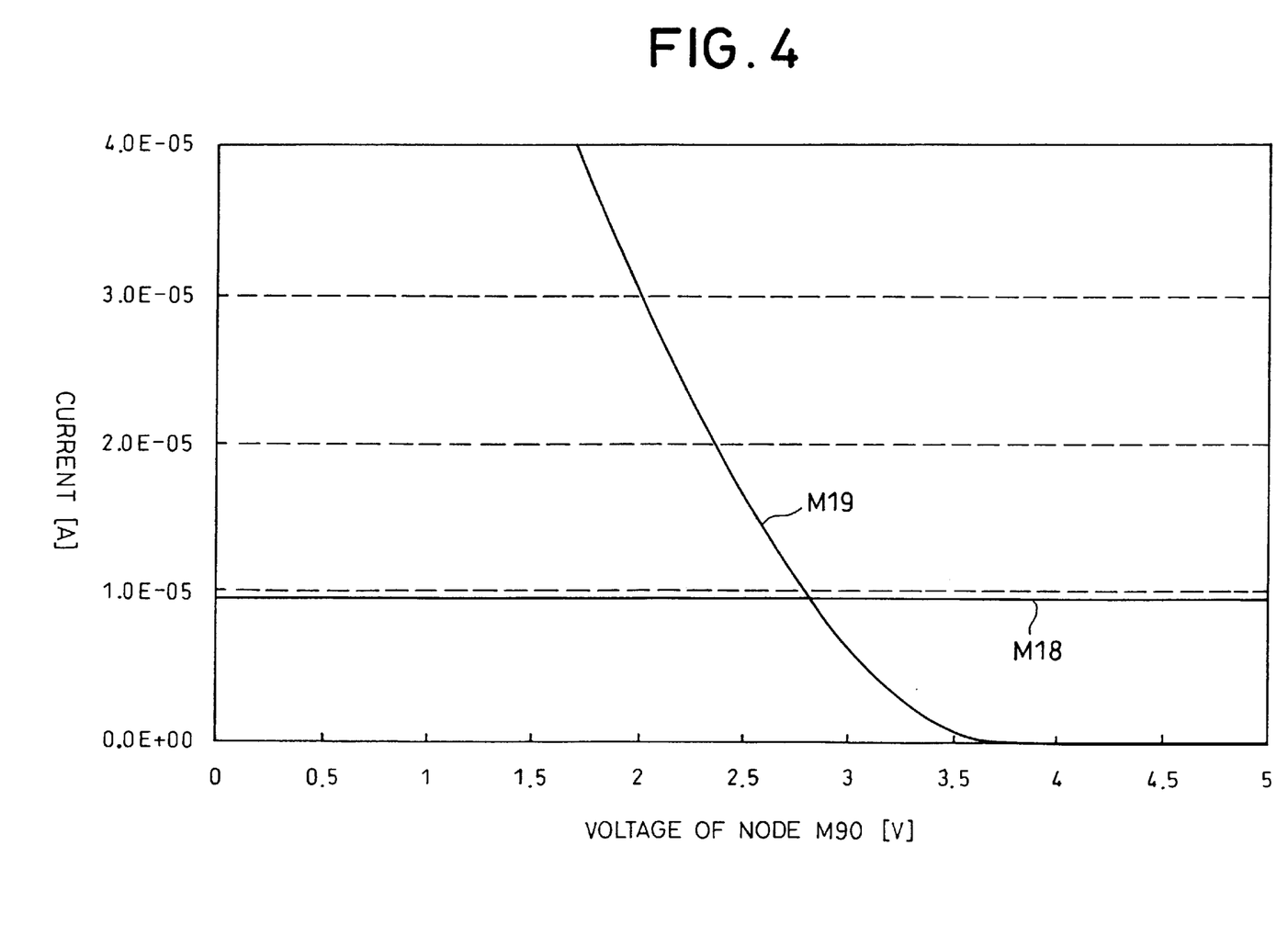
FIG. 4 is an illustration showing operations of transistors M18 and M19 in FIG. 2.

Subsequently, a bias voltage is generated at the node M190 by the transistors M18 and M19. A value of the bias voltage is determined to be about 2.8V as an intersection of DC characteristics of both transistors as illustrated in FIG. 4.

These two bias voltages are controlled. Then, the differential comparing portion operates. Namely, the transistors M8 and M9 are controlled by the bias voltage to serve as a constant current source. In relation to respective transistors M5 and M6, voltages of nodes M80 and M90 are determined.

Figure 5:
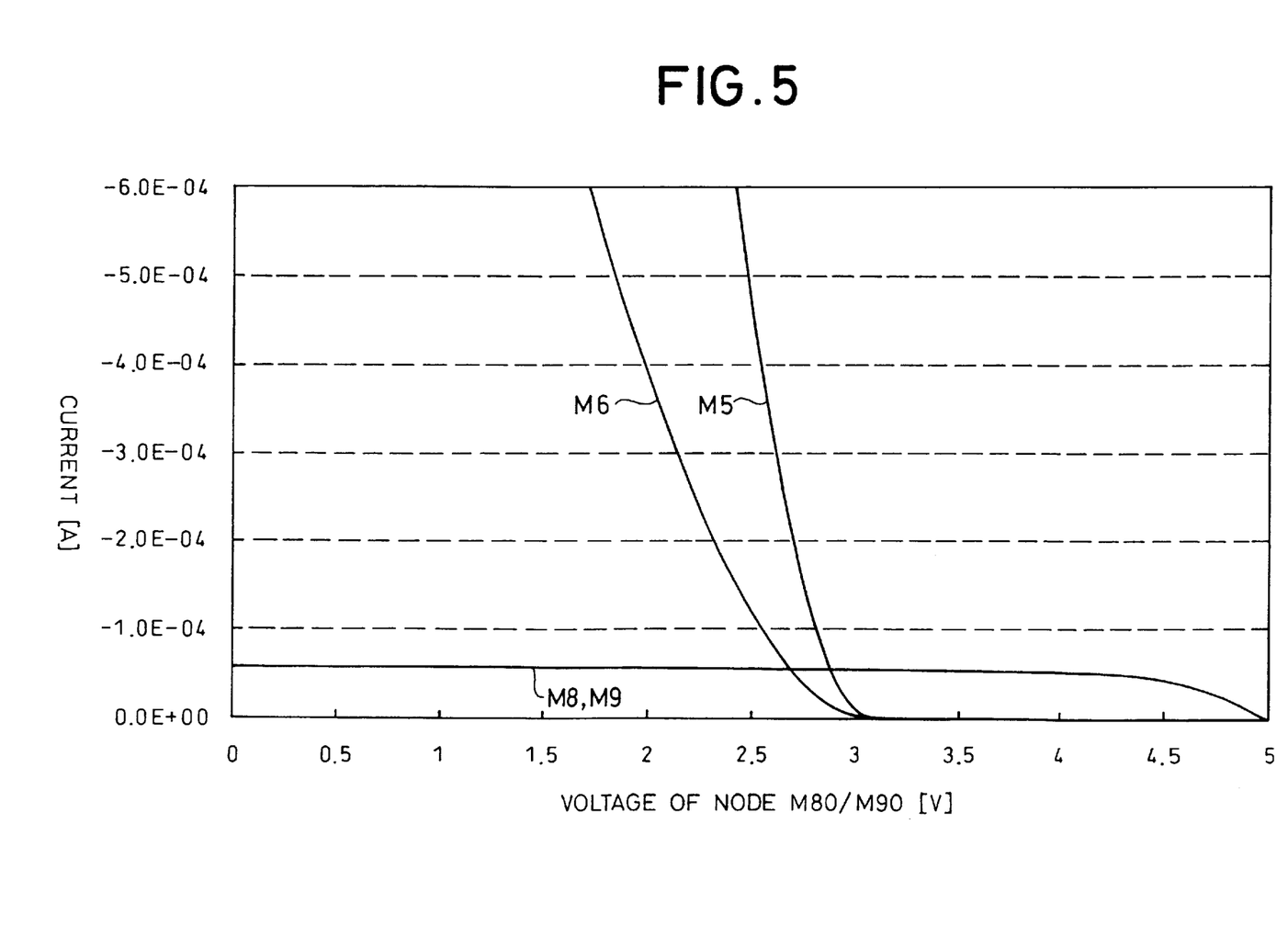
FIG. 5 is an illustration showing operations of transistors M5, M6, M8 and M9 in FIG. 2.

FIG. 5 shows DC characteristics of transistors M8, M9. M5 and M6 when the reference voltage VREF=0V and the input signal voltage level is VIN=0V. As shown in FIG. 5, 2.7V and 2.9V as respective intersections become voltages at the nodes M80 and M90. As set forth above, due to difference of the transistor size of the transistors M5 and M6, an offset is caused.

The transistors M1 and M2 operate receiving voltages of respective nodes M80 and M90. However, by the transistor M7 which operates as a constant current source as controlled by the bias voltage of the node M160, a sum of drain-source current of two transistors becomes constant. Therefore, depending upon difference of ON resistances of the transistors M1 and M2, a difference is caused in the current flowing through both transistors M1 and M2 to cause potential difference between node M30 and M40.

Receiving the level of the node M40 of the differential comparing portion, a comparison result V0 is determined by the transistors M11 and M10 in the comparison result output portion.

Figure 6:
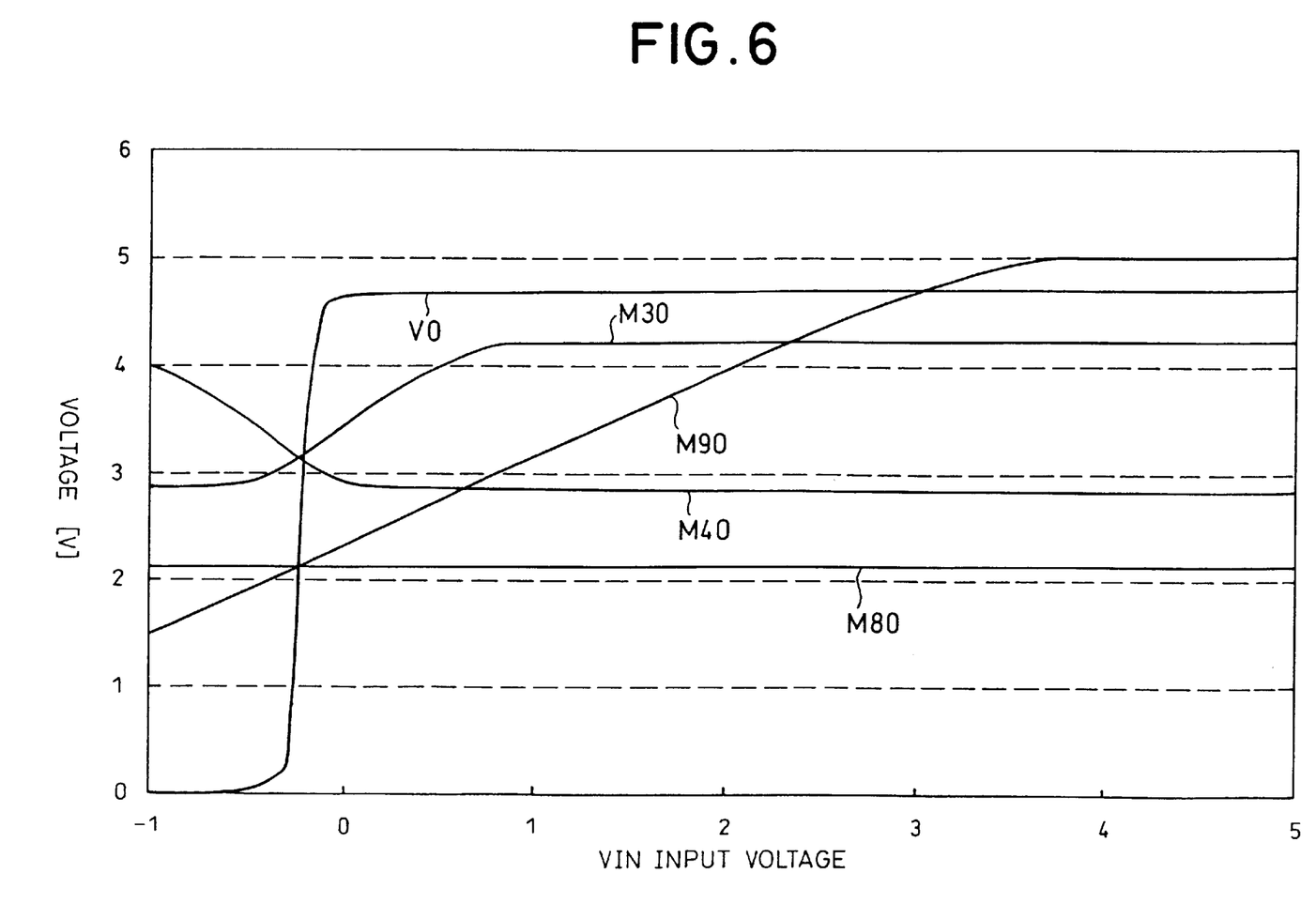
FIG. 6 is an illustration showing a DC characteristics of a differential comparing portion and a comparison result output portion in FIG. 2.

FIG. 6 shows a DC characteristics when the reference voltage and the input signal voltage level of the differential comparing portion and the comparison result output portion are respectively VREF=0V and VIN=−1 to +5V. Since the gate voltage of the transistor M5 serving as the reference voltage VREF is constant, the voltage value of the node M80 becomes constant, whereas the voltage of the node M90 is variable depending upon the value of the input signal voltage level VIN. At VIN=−0.3V, the voltage value of the node M80 becomes equal to the voltage value of the node M90, and the voltage value of a node M30 becomes equal to the voltage value of a node M40. Across this state, when VIN<−0.3V, the voltage value of the node M80 becomes greater than the voltage value of the note M90. Since the voltage value of the node M30 is greater than the voltage value of the node M40, V0="L". When VIN>−0.3V, since the voltage value of the node M80 is smaller than the voltage value of the node M90 and the voltage value of the node M30 is greater than the voltage value of the node M40, V0="H".

Therefore, when VREF=0V is set as in the circuit construction shown in FIG. 1, comparator CMP1 operates as the comparator which outputs V0="L" when VIN<−0.3V and outputs V0="H" when VIN>−0.3V.

Next, discussion will be given for an active clamp portion in FIG. 1.

(1) When Signal STOP="L"

As set forth above, the output CMPOUT of the comparator CMP1 becomes "L" when the input level is greater than or equal to −0.3V, and the clamping transistor NTR1 becomes OFF. Accordingly, in this condition, the interface circuit serves as normal input buffer.

On the other hand, when the input level is smaller than −0.3V, the output CMPOUT of the comparator CMP1 becomes "H", and the clamping transistor NTR1 turns ON. In this condition, the interface circuit serves for clamping the input level at 0V.

Figure 7:
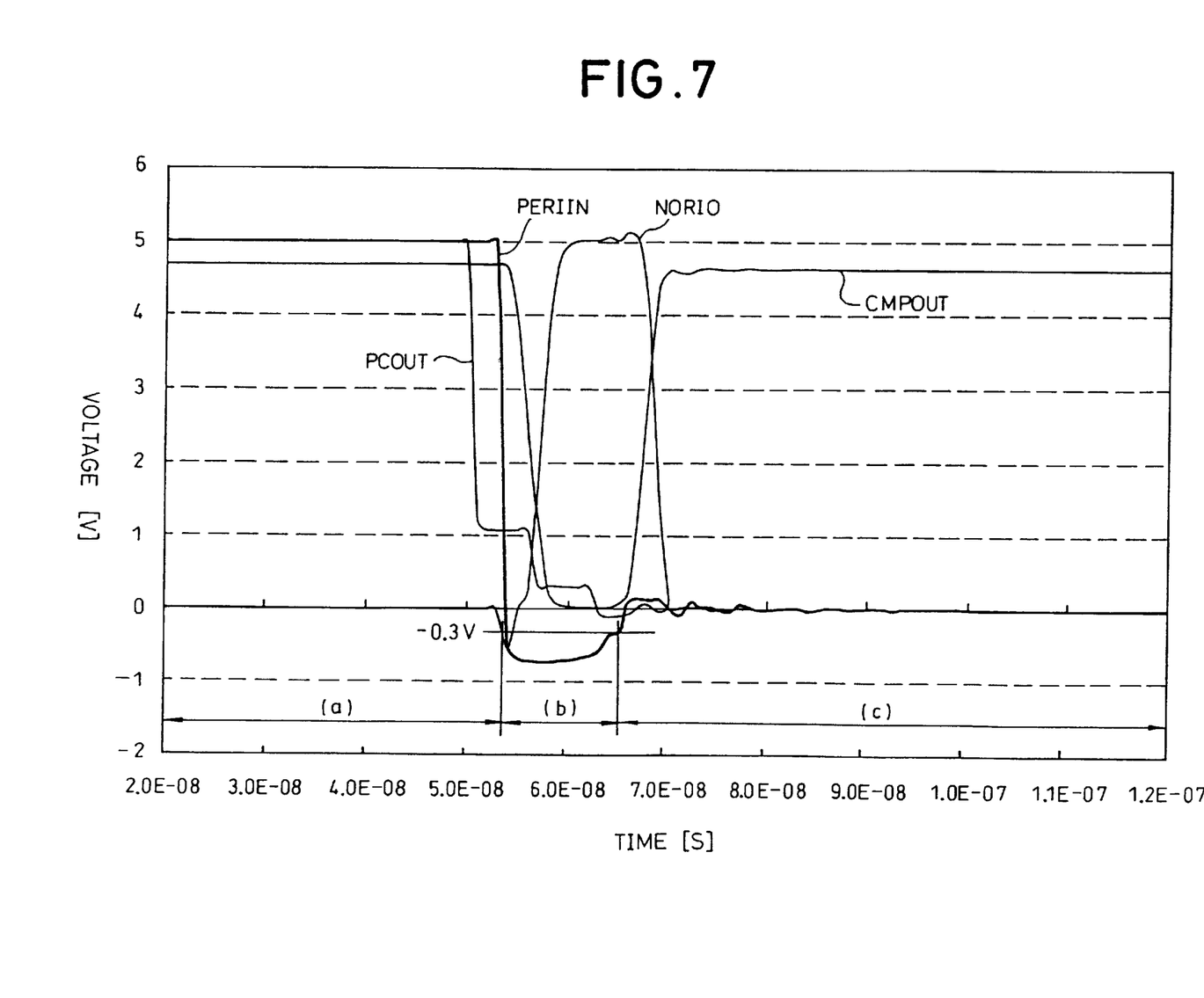
FIG. 7 is a waveform showing a result of simulation of operation of FIG. 1.

A result of simulation simulating what effect of the foregoing operation would be achieved for the ringing waveform is illustrated in FIG. 7. In FIG. 7, PCOUT corresponds to the output signal of the output buffer 1 on the side of the PC in FIG. 1, PERIIN corresponds to the input signal of the input buffer 5 on the side of the peripheral device, CMPOUT corresponds to the comparison result output signal of the comparator CMP1, and NOR10 corresponds to the output signal of the two-input NOR gate NOR1.

In FIG. 7, in a period (a), the signal PERIIN is greater than −0.3V, the output CMPOUT of the comparator CMP1 is "H".

In a period (b), the signal PERIIN is fallen to lower the level thereof below −0.3V. Therefore, after about 5 ns of an operation delay of the comparator CMP1, the output CMPOUT of the comparator CMP1 becomes "L". In response to "L" level comparator output CMPOUT, the clamping NMOS transistor NTR1 is turned ON.

In a period (c), the signal PERIIN becomes higher than −0.3V, CMPOUT becomes "H" again. Thus, NOR10 becomes "L" to turn OFF the clamping NMOS transistor NTR1.

As a result of sequence of operation, and as can be appreciated from comparison with FIG. 11, the ringing level is lowered to be smaller than 0.8V.

(2) When Signal STOP="H"

In STOP mode, the output of the NOR gate NOR 1 becomes "L" to turn OFF the clamping NMOS transistor NTR1. Therefore, the interface circuit operates as normal buffer irrespective of the level of the input signal. On the other hand, in response to STOP="H", the comparator CMP1 is cut off a DC current path to stop.

As set forth above, according to the present invention, ringing of the input waveform can be reduced. Therefore, as shown in FIG. 11, a problem of occurrence of ringing exceeding 0.8V as the input level specification on low side of the TTL to cause malfunction, can be resolved.

Figure 8:
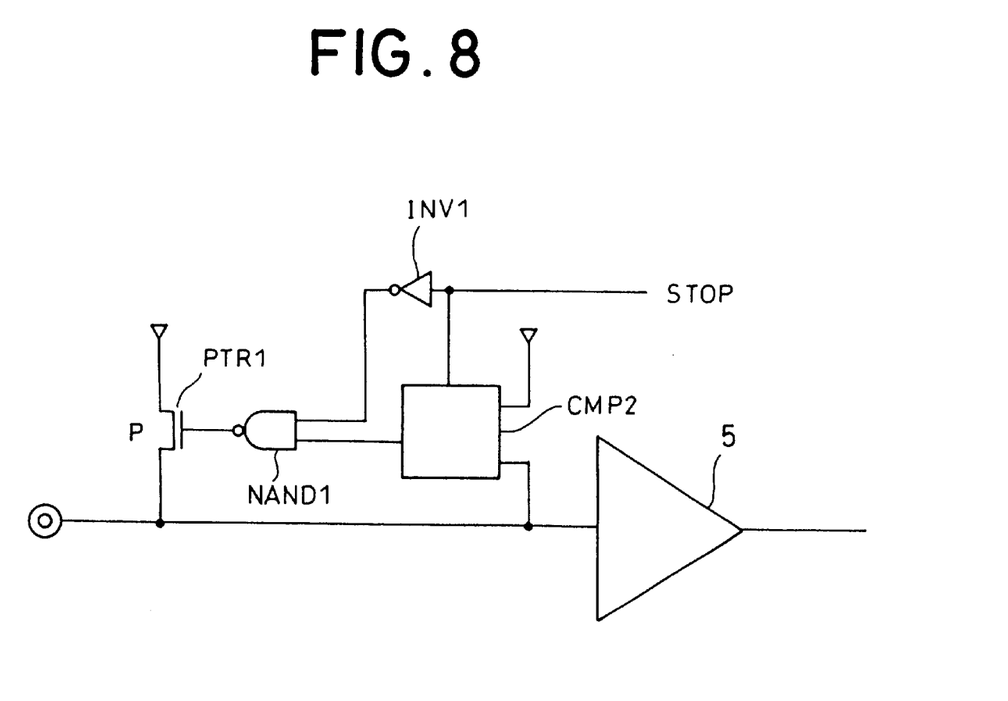
FIG. 8 is a block diagram showing a construction of the second embodiment of the interface circuit and the input buffer integrated circuit including the same according to the present invention.

The second embodiment of the input buffer according to the present invention is illustrated in FIG. 8. In FIG. 8, the input buffer with an active clamp is constructed with the input buffer 5, a comparator CMP2, a clamping transistor PTR1, an inverter INV1 and a two-input NAND gate NAND1. Conversely with the first embodiment, the shown embodiment of the input buffer is added a clamping circuit on the side of the power source VDD to perform suppression of ringing on rising side of the waveform.

Figure 9:
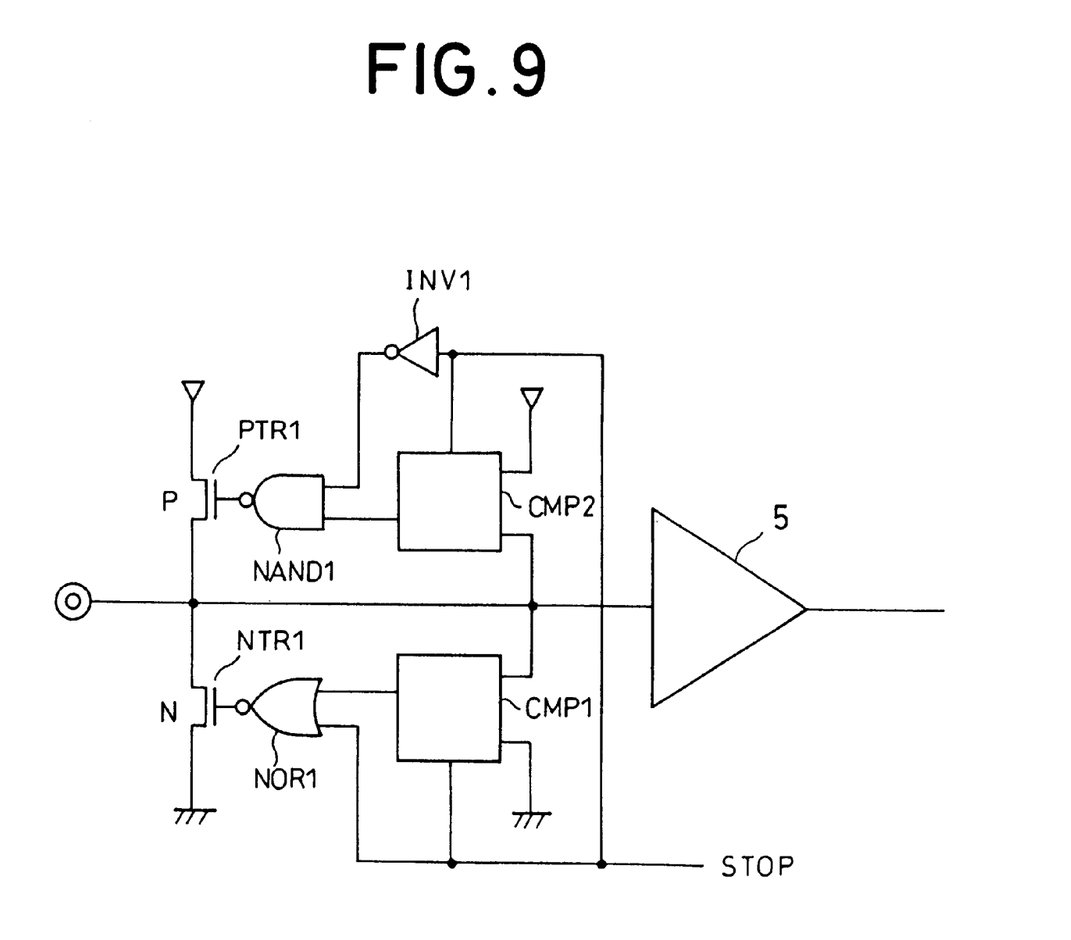
FIG. 9 is a block diagram showing a construction of the third embodiment of the interface circuit and the input buffer integrated circuit including the same according to the present invention.

Next, the third embodiment of the input buffer according to the present invention is illustrated in FIG. 9. In FIG. 9, there is provided a ground (GND) side clamping circuit constructed with the comparator CMP1, the clamping transistor NTR1 and the two-input NOR gate NORI, and a power source (VDD) side clamping circuit constructed with the comparator CMP2, the clamping transistor PTR1, the inverter INVL and the two-input NAND gate NAND1. By providing two clamping circuits, ringing can be suppressed on rising side and falling side of the input waveform.

As set forth above, conventionally, as shown in FIG. 10, the output buffer 2 on the side of the PC and the input buffer 5 are merely connected via the connection cable 3. In contrast to this, the active clamping circuit is provided in the present invention. Particularly, one or more comparators comparing the input level with the reference potential and outputting comparison result and pull-up transistor or pull-down transistor to be controlled ON and OFF depending upon the comparison result are provided. When the voltage level lower than or equal to the predetermined level is applied to the input of the input buffer , the active clamping circuit acts to clamp the level at 0V. By this, ringing on the rising side or falling side due to under-shooting or over-shooting of the input waveform can be reduced.

As set forth above, the present invention can effectively prevent ringing of the signal wave by controlling the input signal level depending upon the comparison result with the predetermined reference level.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. An interface circuit for reducing ringing provided in a second device receiving as an input an output signal of a first device wherein an output impedance of said first device and an input impedance of said second device are unmatched, said interface circuit controlling an input signal level to an input buffer receiving said output signal, comprising control means for clamping said input signal level depending upon a result of comparison of a level of said output signal and a predetermined reference level to reduce ringing due to one of under-shooting and overshooting of said input signal.

2. An interface circuit as set forth in claim 1, wherein said control means includes a comparator circuit comparing said output signal level and said reference level and a switching element turning ON and OFF depending upon the result of comparison of said comparator circuit for controlling said input signal level.

3. An interface circuit as set forth in claim 2, wherein said switching element is a pull-up transistor connected between a signal line transmitting said output signal and a power source and controls state of electrical connection between said signal line and said power source depending upon said comparison result.

4. An interface circuit as set forth in claim 1, wherein said first device is a personal computer and said second device is a peripheral device.

5. An interface circuit as set forth in claim 4, wherein said peripheral device is a floppy disk drive.

6. An interface circuit as set forth in claim 4, wherein said peripheral device is a magnetic disk drive.

7. An interface circuit provided in a second device inputting an output signal of a first device, controlling an input signal level to an input buffer inputting said output signal, comprising control means for controlling said input signal level depending upon a result of comparison of a level of said output signal and a predetermined reference level, wherein said control means includes a comparator circuit comparing said output signal level and said reference level and a switching element turning ON and OFF depending upon the result or comparison of said comparator circuit for controlling said input signal level, wherein said switching element is a pull-down transistor connected between a signal line transmitting said output signal and the ground and controls state of electrical connection between said signal line and said ground depending upon said comparison result.

8. An input buffer integrated circuit for reducing ringing comprising:

an input buffer provided in a second device receiving as an input an output signal of a first device, said first device and said second device having unmatched input and output impedances;

an interface circuit provided in said second device, integrated with said input buffer on a single chip for forming an integrated circuit, and including control means for clamping a level of said input signal depending upon a result of comparison of a level of said output signal and a predetermined reference level to reduce ringing due to one of under-shooting and overshooting of said input signal.

9. An input buffer integrated circuit as set forth in claim 8, wherein said control means includes a comparator circuit comparing said output signal level and said reference level and a switching element turning ON and OFF depending upon the result of comparison of said comparator circuit f or controlling said input signal level.

10. An input buffer integrated circuit as set forth in claim 9, wherein said switching element is a pull-up transistor connected between a signal line transmitting said output signal and a power source and controls state of electrical connection between said signal line and said power source depending upon said comparison result.

11. An input buffer integrated circuit as set forth in claim 8, wherein said first device is a personal computer, and said second device is a peripheral device.

12. An input buffer integrated circuit as set forth in claim 8, wherein a plurality of interface circuits are provided and said interface circuits are set said reference levels at mutually different values.

13. An input buffer integrated circuit as set forth in claim 11, wherein said peripheral device is a floppy disk drive.

14. An input buffer integrated circuit as set forth in claim 11, wherein said peripheral device is a magnetic disk drive.

15. An input buffer integrated circuit comprising:

an input buffer provided in a second device inputting an output signal of a first device and inputting said output signal;

an interface circuit provided in said second device, integrated with said input buffer on a single chip for forming an integrated circuit, and including control means for controlling a level of said input signal depending upon a result of comparison of a level of said output signal and a predetermined reference level, wherein said control means includes a comparator circuit comparing said output signal level and said reference level and a switching element turning ON and OFF depending upon the result of comparison of said comparator circuit f or controlling said input signal level, wherein said switching element is a pull-down transistor connected between a signal line transmitting said output signal and the ground and controls state of electrical connection between said signal line and said ground depending upon said comparison result.

* * * * *